(12) United States Patent
Kim et al.

(10) Patent No.: US 12,340,983 B2
(45) Date of Patent: Jun. 24, 2025

(54) APPARATUS FOR TREATING SUBSTRATE AND METHOD FOR TREATING SUBSTRATE

(71) Applicant: SEMES CO., LTD., Cheonan-si (KR)

(72) Inventors: Dong-Hun Kim, Seoul (KR); Wan Jae Park, Hwaseong-si (KR); Ji Hoon Park, Suwon-si (KR); Du Ri Kim, Incheon (KR)

(73) Assignee: Semes Co., LTD., Cheonan-si (KR)

( * ) Notice: Subject to any disclaimer, the term of this patent is extended or adjusted under 35 U.S.C. 154(b) by 500 days.

(21) Appl. No.: 17/752,079

(22) Filed: May 24, 2022

(65) Prior Publication Data
US 2022/0384153 A1 Dec. 1, 2022

(30) Foreign Application Priority Data
May 25, 2021 (KR) .......................... 10-2021-0066569

(51) Int. Cl.
*H01J 37/32* (2006.01)
*H01J 61/30* (2006.01)
*H01J 65/04* (2006.01)

(52) U.S. Cl.
CPC .. *H01J 37/32522* (2013.01); *H01J 37/32422* (2013.01); *H01J 37/3244* (2013.01);
(Continued)

(58) Field of Classification Search
CPC .......... H01J 37/32522; H01J 37/32422; H01J 37/3244; H01J 61/302; H01J 65/042;
(Continued)

(56) References Cited

U.S. PATENT DOCUMENTS 6,951,821 B2 10/2005 Hamelin et al.
2008/0289650 A1* 11/2008 Arena ................. C23C 16/0236
134/1

FOREIGN PATENT DOCUMENTS

JP S62-45122 A 2/1987
JP S62-106618 A 5/1987
(Continued)

OTHER PUBLICATIONS

Korean Office Action dated Apr. 7, 2023 issued in corresponding Korean Appln. No. 10-2021-0066569.
(Continued)

*Primary Examiner* — Rudy Zervigon
(74) *Attorney, Agent, or Firm* — HARNESS, DICKEY & PIERCE, P.L.C.

(57) ABSTRACT

The inventive concept provides a substrate treating apparatus. The substrate treating apparatus includes a chamber having an inner space; a plasma source configured to apply an electric field; a first gas supply unit configured to supply a first process gas to a region to which the plasma source applies the electric field, the first process gas excited to a plasma when the first process gas is applied with an electric field of a first intensity at a first pressure atmosphere; a support unit disposed in the inner space and configured to support a substrate to be treated; and an electrodeless lamp disposed above the substrate in the inner space, and wherein the electrodeless lamp includes an electric field transmissive housing having a discharging space therein; and a discharging material including a luminous material and filling the discharging space, the discharging space of the housing being pressurized to a second pressure, and the discharging material discharging and luminating when applied with an electric field of a second intensity higher than the first intensity at a second pressure.

20 Claims, 7 Drawing Sheets

(52) U.S. Cl.
CPC .......... *H01J 61/302* (2013.01); *H01J 65/042* (2013.01); *H01J 37/3222* (2013.01); *H01J 2237/335* (2013.01)

(58) Field of Classification Search
CPC ............. H01J 37/3222; H01J 2237/335; H01J 37/32449; H01J 37/32348; H01J 37/32513; H01J 37/32559; H01J 65/00; H01J 37/20; H01J 37/32091; H01J 37/321; H01J 37/32192; H01J 2237/334; H01L 21/67028; H01L 21/67069; H01L 21/67115
USPC .................. 118/723 MW, 723 ME, 723 MR, 118/723 MA; 156/345.36, 345.41
See application file for complete search history.

(56) References Cited

FOREIGN PATENT DOCUMENTS

| | | |
|---|---|---|
| JP | H05-243138 A | 9/1993 |
| JP | 2010-123739 A | 6/2010 |
| JP | 2016-076452 A | 5/2016 |
| JP | 2018-050055 A | 3/2018 |
| KR | 10-2007-0049671 A | 5/2007 |
| KR | 101352995 B1 | 1/2014 |
| KR | 10-2015-0023504 A | 3/2015 |
| WO | WO-2006/038672 A1 | 4/2006 |
| WO | WO-2020/100227 A1 | 5/2020 |

OTHER PUBLICATIONS

Japanese Office Action dated Apr. 25, 2023 issued in corresponding Japanese Appln. No. 2022-084368.

* cited by examiner

APPARATUS FOR TREATING SUBSTRATE AND METHOD FOR TREATING SUBSTRATE

CROSS-REFERENCE TO RELATED APPLICATIONS

A claim for priority under 35 U.S.C. § 119 is made to Korean Patent Application No. 10-2021-0066569 filed on May 25, 2021, in the Korean Intellectual Property Office, the entire contents of which are hereby incorporated by reference.

BACKGROUND

Embodiments of the inventive concept described herein relate to a substrate treating apparatus and a substrate treating method.

A plasma may be used in a treating process of a substrate. For example, a plasma may be used in a dry cleaning process, an ashing process, or an etching process. The plasma is generated by a very high temperature, a strong electric field, or an RF electromagnetic field, and the plasma refers to an ionized gas state consisting of ions, electrons, and radicals or the like. The dry cleaning process, the ashing process, or the etching process using the plasma is performed by colliding ions or radical particles contained in the plasma with the substrate.

In addition, a heat treatment is performed to improve a uniformity and a film quality of a semiconductor wafer surface, or to remove substrate surface treatment by-products. Therefore, a semiconductor manufacturing facility includes two types of chambers: chambers for a plasma treatment and chambers for a heat treatment.

However, when the chambers for the plasma treatment and the heat treatment are separated, a footprint of the facility increases, resulting in a decrease in a WPPS (wafer per price and space), and a transfer time between chambers results in a decrease in a UPEH (Unit Per Equipment Hour).

SUMMARY

Embodiments of the inventive concept provide a substrate treating apparatus and a substrate treating method for effectively treating a substrate.

Embodiments of the inventive concept provide a substrate treating apparatus and a substrate treating method capable of decreasing a footprint of a facility, resulting in an increase in a WPPS (wafer per price and space), and avoiding a transfer time between chambers, resulting in an increase in a UPEH (unit per equipment hour), by being capable of performing a plasma treatment and a heat treatment in one chamber.

Embodiments of the inventive concept provide a substrate treating apparatus and a substrate treating method capable of exciting a process gas to a plasma, and/or supplying a heat energy for removing by-products, selectively, with one electric source.

Embodiments of the inventive concept provide a substrate treating apparatus and a substrate treating method using an electrodeless lamp capable of increasing a replacement cycle when compared with using another lamp.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a chamber having an inner space; a plasma source configured to apply an electric field; a first gas supply unit configured to supply a first process gas to a region to which the plasma source applies the electric field, the first process gas excited to a plasma when the first process gas is applied with an electric field of a first intensity at a first pressure atmosphere; a support unit disposed in the inner space and configured to support a substrate to be treated; and an electrodeless lamp disposed above the substrate in the inner space, and wherein the electrodeless lamp comprises: an electric field transmissive housing having a discharging space therein; and a discharging material including a luminous material and filling the discharging space, the discharging space of the housing being pressurized to a second pressure, and the discharging material discharging and luminating when applied with an electric field of a second intensity higher than the first intensity at a second pressure.

In an embodiment, the luminous material comprises a sulfur-containing material, a metal sulfide, a metal halide, a mercury, or a fluorescent material.

In an embodiment, the discharging material is a mixed gas of an inert gas and the luminous material.

In an embodiment, the second pressure is higher than the first pressure.

In an embodiment, the discharging space of the housing has a first volume, and a size of the first volume is in proportion to an electric field of the second intensity applied by the plasma source.

In an embodiment, the housing comprises a dielectric.

In an embodiment, the housing comprises a quartz or a $Y_2O_3$.

In an embodiment, the substrate treating apparatus further includes a plate-shape ion blocker dividing the inner space of the chamber into a first space and a second space below the first space, having a plurality of through-holes, and grounded, and wherein the electrodeless lamp is coupled to the ion blocker.

In an embodiment, the first gas supply unit supplies the first process gas to the first space.

In an embodiment, the substrate treating apparatus further includes a second gas supply unit configured to supply a second process gas to the second space, and wherein the plasma source is configured to supply the electric field to the first space.

In an embodiment, the first supply gas is gas including a fluorine.

In an embodiment, the second process gas is a gas including a hydrogen.

In an embodiment, the electrodeless lamp is provided at a center of the ion blocker.

In an embodiment, the electrodeless lamp is provided in a plurality.

In an embodiment, a side wall and a top wall of the discharging space of the housing comprise a reflective coating.

In an embodiment, the substrate treating apparatus further includes a controller, and wherein the controller is configured to perform: a first treating for a divergence of the electric field of the first intensity by the plasma source at the first pressure atmosphere while supplying the first process gas from the first gas supply unit to generate a plasma from the first process gas, and treating a substrate with radicals or ions of the plasma; and a second treating for discharging the electrodeless lamp to heat treat a substrate by stopping the supplying of the first process gas, exhausting the first process gas in the inner space and causing the plasma source to diverge the electric field of the second intensity.

In an embodiment, the substrate treating apparatus further includes a controller, and wherein the controller is configured to perform: a first treating for a divergence of an electric field of the first intensity by the plasma source at the first pressure atmosphere while supplying the first process gas from the first gas supply unit and supplying the second process gas from the second gas supply unit to generate a plasma from the first process gas, and treating a substrate with a reaction resultant between radicals of the plasma and the second process gas; and a second treating for discharging the electrodeless lamp to heat treat a substrate by stopping the supplying of the first process gas and the second process gas, exhausting the reaction resultant and causing the plasma source to diverge the electric field of the second intensity.

In an embodiment, the plasma source is selected from a group consisting of an ICP, a TCP, a CCP, a DF-CCP, and a microwave.

In an embodiment, a light from the electrodeless lamp includes a wavelength which can be absorbed by by-products of a surface of the substrate.

The inventive concept provides a substrate treating method. The substrate treating method includes a first treating for a divergence of an electric field of a first intensity by a plasma source at a first pressure atmosphere while supplying a process gas to generate a plasma from the process gas, and treating a substrate with radicals or ions of the plasma; a second treating for discharging an electrodeless lamp to heat treat a substrate by stopping a supplying of the process gas, exhausting the process gas and causing the plasma source to generate an electric field of a second intensity; and wherein the second intensity is higher than the first intensity, and wherein the electrodeless lamp does not operate at the first intensity.

The inventive concept provides a substrate treating apparatus. The substrate treating apparatus includes a chamber having an inner space; a plate-shape ion blocker dividing the inner space of the chamber into a first space and a second space below the first space, having a plurality of through holes, and grounded; a plasma source configured to apply an electric field to the first space; a first gas supply unit configured to supply a first process gas to the first space, the first process gas excited to a plasma when the first process gas is applied with an electric field of a first intensity at a first pressure atmosphere; a second gas supply unit configured to supply a second process gas to the second space; a support unit disposed in the second space and configured to support a substrate to be treated; and an electrodeless lamp disposed at a center of the ion blocker; and a controller, wherein the electrodeless lamp comprises: an electric field transmissive housing having a discharging space therein; and a discharging material including a luminous material and filling the discharging space, the discharging space of the housing being pressurized to a second pressure, and the discharging material discharging and luminating when applied with an electric field of a second intensity higher than the first intensity at a second pressure atmosphere, and the controller is configured to perform: a first treating for a divergence of an electric field of the first intensity by the plasma source at the first pressure atmosphere while supplying the first process gas from the first gas supply unit and supplying the second process gas from the second gas supply unit to generate a plasma from the first process gas, and treating a substrate with a reaction resultant between radicals of the plasma and the second process; and a second treating for discharging the electrodeless lamp to heat treat a substrate by stopping the supplying of the first process gas and the second process gas, exhausting the reaction resultant and causing the plasma source to diverge the electric field of the second intensity.

According to an embodiment of the inventive concept, a substrate may be effectively treated.

According to an embodiment of the inventive concept, due to being capable of performing a plasma treatment and a heat treatment in one chamber, a footprint of a facility decreases, resulting in an increase in a WPPS (wafer per price and space), and avoiding a transfer time between chambers, resulting in an increase of a UPEH (unit per equipment hour).

According to an embodiment of the inventive concept, a process gas may be excited to a plasma, and/or a heat energy for removing by-products is supplied, selectively, with one power source.

According to an embodiment of the inventive concept, an electrodeless lamp may be used to increase a replacement cycle when compared with using other lamp, e.g., electrode lamp.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
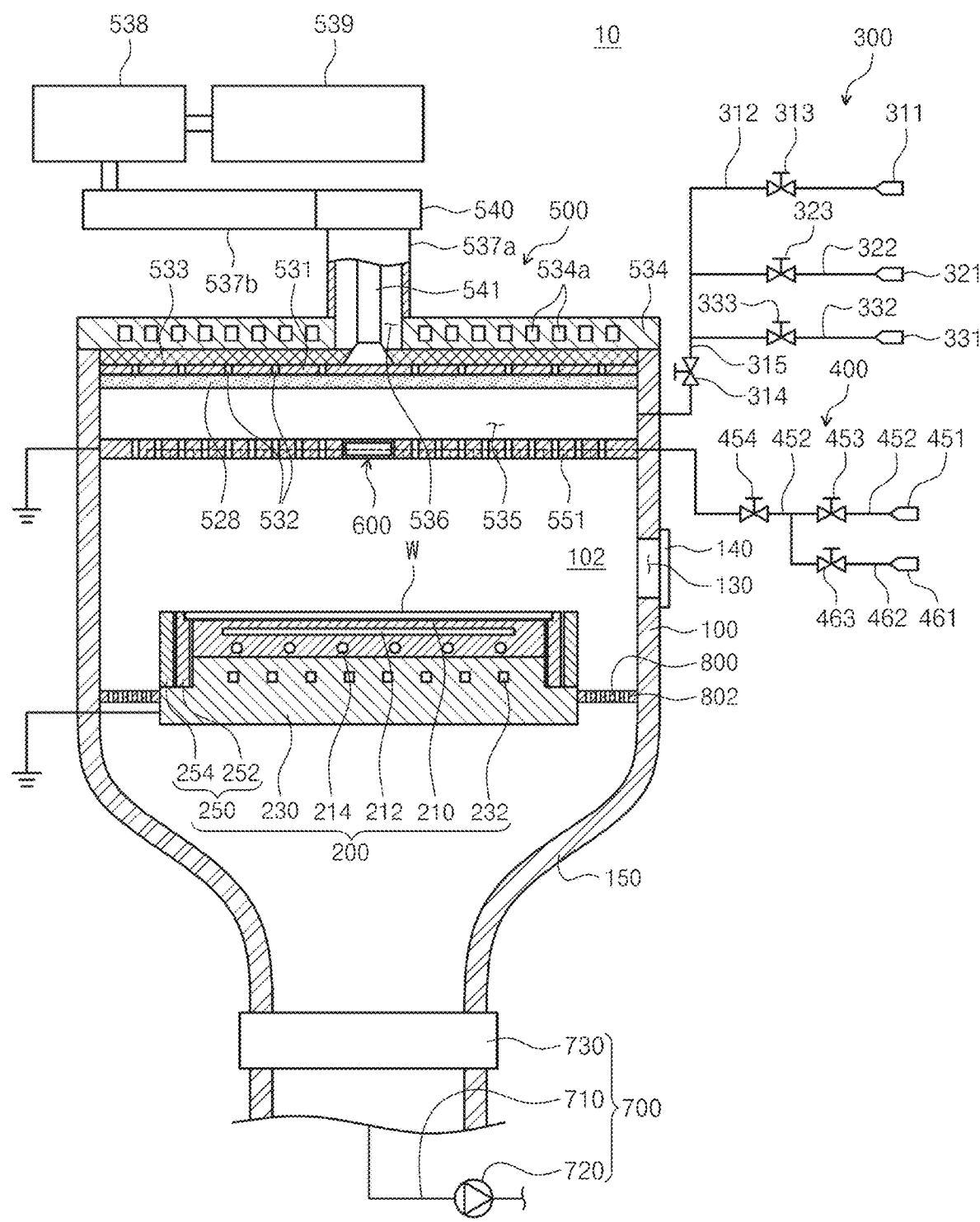
FIG. 1 is a schematic cross-sectional view of a substrate treating apparatus according to a first embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. The embodiments are provided to more fully explain the inventive concept to a person with average knowledge in the art. Therefore, the form of the elements in the drawings has been exaggerated to emphasize a clearer description.

In the inventive concept, a substrate treating apparatus for dry cleaning, cleaning, or etching a substrate using a plasma within a chamber will be described as an embodiment. However, the inventive concept invention is not limited thereto, and any apparatus that processes a substrate using a plasma may be applied to various processes.

FIG. 1 is a schematic cross-sectional view of a substrate treating apparatus according to a first embodiment of the inventive concept. Referring to FIG. 1, the substrate treating apparatus 10 includes a process chamber 100, a support unit 200, a first process gas supply unit 300, a second process gas supply unit 400, a plasma source 500, an exhaust baffle 800, and an exhaust unit 700.

The process chamber 100 has an inner space. Among the inner space, a second space 102 provides a space in which the substrate W is treated therein. The process chamber 100 has a circular cylindrical shape. The process chamber 100 may be made of or comprise a metal material. For example, the process chamber 100 may be made of an aluminum material. An opening 130 is formed at a side wall of the process chamber 100. The opening 130 is provided as a passage through which the substrate W may be taken in and out. The opening 130 may be opened and closed by a door 140. An exhaust port 150 is installed at a bottom side of the process chamber 100. The exhaust port 150 is concentric with the process chamber 100. The exhaust port 150 functions as an outlet through which by-products generated in the second space 102 are discharged to an outside of the process chamber 100.

The support unit 200 is provided in the second space 102 to support the substrate W. The support unit 200 may be provided as an electrostatic chuck for supporting the substrate W using an electrostatic force.

In an embodiment, the support unit 200 includes a dielectric plate 210, a focus ring 250, and a base 230. The substrate W is directly placed on a top surface of the dielectric plate 210. The dielectric plate 210 has a disk shape. The dielectric plate 210 may have a smaller radius than that of the substrate W. An inner electrode 212 is installed within the dielectric plate 210. A power source (not shown) is connected to the inner electrode 212 and a power is applied from the power source (not shown) to the inner electrode 212. The inner electrode 212 provides an electrostatic force so that the substrate W is sucked to the dielectric plate 210. A heater 214 for heating the substrate W is installed within the dielectric plate 210. The heater 214 may be positioned under the inner electrode 212. The heater 214 may be provided as a spiral coil. For example, the dielectric plate 210 may be made of a ceramic material.

The base 230 supports the dielectric plate 210. The base 230 is positioned under the dielectric plate 210 and is fixedly coupled to the dielectric plate 210. A top surface of the base 230 has a stepped shape such that a central area thereof is higher than an edge area. The upper step portion of the base 230 may have a top surface area corresponding a bottom surface area of the dielectric plate 210. A cooling fluid channel 232 is formed within the base 230. The cooling fluid channel 232 is provided as a passage through which a cooling fluid circulates. The cooling fluid channel 232 may have a spiral shape within the base 230. The base 230 may be electrically grounded. However, in an embodiment not shown, the base 230 may be connected to a high frequency power source (not shown) located outside. The base 230 may be made of or comprise a metal material.

The focus ring 250 is provided to surround an outer periphery of the dielectric plate 210 and the substrate W. The focus ring 250 focuses a plasma on the substrate W. In an embodiment, the focus ring 250 may include an inner ring 252 and an outer ring 254. An inner top portion of the inner ring 252 is formed to be stepped, so that an edge of the substrate W may be placed on the stepped portion. The focus ring 250 is a ring around the electrostatic chuck ESC on which a wafer is placed, and is formed of a silicon oxide layer (SiO2), a silicon single crystal, or a silicon fluoride layer (SiF). In addition, the focus ring 250 may be replaced when worn.

The plasma source 500 applies an electric field. According to an embodiment, the plasma source 500 may be a microwave.

A microwave transmission plate 528 is provided to close an opening of a top portion of the chamber 100. The microwave transmission plate 528 is made of a dielectric material, for example, a ceramic such as a quartz or an $Al_2O_3$.

A disk-shaped planar antenna 531 is provided above the microwave transmission plate 528. The planar antenna 531 is disposed to face the support unit 200 with the microwave transmission plate 528 interposed therebetween. The planar antenna 531 is made of a conductor, for example, a copper plate or an aluminum plate with a surface thereof being gold-plated. A plurality of microwave radiation holes (slots) (not shown) may be formed in a predetermined pattern at the planar antenna 531. For example, the planar antenna 531 may constitute an RLSA antenna.

A slow-wave plate 533 made of a dielectric material having a dielectric constant greater than that of a vacuum is provided on a top surface of the planar antenna 531. A slow-wave plate 533 shortens a wavelength of the microwave within the slow-wave plate compared to a wavelength of the microwave within a vacuum.

A shield cover 534 is provided on a top surface of the chamber 100 to cover the planar antenna 531 and the slow-wave plate 533. The shield cover 534 is made of a metal material such as aluminum or a stainless steel, for example. The top surface of the chamber 100 and the shield cover 534 are sealed by a sealing member (not shown).

A coolant fluid channel 534a is formed at the shield cover 534. By allowing a coolant to flow through the coolant fluid channel 534a, the planar antenna 531, the microwave transmission plate 528, the slow-wave plate 533, and the shield cover 534 may be cooled. The shield cover 534 is grounded.

An opening 536 is formed at the shield cover 534. A waveguides 537a and 537b are connected to the opening 536. A microwave generator 539 is connected to end portions of the waveguides 537a and 537b with a matching circuit 538 interposed therebetween. Accordingly, microwaves generated by the microwave generator 539 propagate to the planar antenna member 531 through the waveguides 537a and 537b.

The waveguides 537a and 537b may include a cross-sectional circular coaxial waveguide 537a upwardly extending from an opening 536 of the shield cover 534, and a cross-sectional rectangular waveguide 537b connected to a top end of the coaxial waveguide 537a and horizontally extending. A mode converter 540 may be provided at a connection portion of the rectangular waveguide 537b with the coaxial waveguide 537a. An inner conductor 541 is extended in the center of the coaxial waveguide 537a. A bottom end of the inner conductor 541 is connected and fixed to a center of the planar antenna 531.

The plasma source 500 may apply electric fields with various intensity. For example, the plasma source 500 may apply a first electric field having a first intensity and a second electric field having a second intensity. The intensity of the electric field can also be expressed as a density of the electric field.

The first process gas supply unit 300 includes a first gas supply source 311 and a first gas supply line 312, and the first gas supply line 312 is provided withy flow rate adjusting members 313 and 314 and a heating member 315.

The first gas supply source 311 stores a first gas. The first gas is a gas including a fluorine. In an embodiment, the first gas may be an $NF_3$.

The first gas supply line 312 is provided as a fluid passage connecting the first gas supply source 311 and the process chamber 100. The first gas supply line 312 supplies the first gas stored at the first gas supply source 311 to the inner space of the process chamber 100. Specifically, the first gas supply line 312 supplies the first gas to a first space 535.

To further supply a gas mixed with the first gas, the first process gas supply unit 300 may further include a second gas source 321 supplying a second gas different from the first gas, and/or a third gas source 331 supplying a third gas different from the first gas and the second gas. The second gas supply source 321 is connected to the first gas supply line 312 through the second gas supply line 322. The third gas supply source 331 is connected to the first gas supply line 312 through the third gas supply line 332. A flow rate adjusting member 323 may be installed at the second gas supply line 322. The flow rate adjusting member 333 may be installed at the third gas supply line 332. The second gas may be an inert gas. For example, the second gas may be argon Ar. The third gas may be an inert gas of a different type from the second gas. For example, the third gas may be a helium He.

The first process gas may be defined by a combination of the first gas and one or more of the second gas and the third gas. Alternatively, the first gas may be defined as the first process gas alone. Further, the first process gas may further include other gases in addition to above-mentioned gas.

The planar antenna 531 and the ion blocker 551 are disposed to face each other, and the planar antenna 531 is disposed above the ion blocker 551. The first space 535 is defined between the microwave transmission plate 528 and the ion blocker 551. The inner space of the process chamber 100 is divided into the second space 102 and the first space 535 by an ion blocker 551. The first space 535 is connected to the first process gas supply unit 300 that supplies the first process gas.

The electromagnetic field generated at the first space 535 excites the first process gas to a plasma state. The heated first process gas is introduced into the first space 535 and excited into a plasma state by the electromagnetic field generated at the first space 535. As the first process gas is changed to the plasma state, into ions, electrons, and radicals are generated. The generated radical component passes through the ion blocker 551 and moves to the second space 102.

The ion blocker 551 is provided between the second space 102 which is a treating space and the first space 535, and forms a boundary between the second space 102 and the first space 535. The ion blocker 551 may be made of or comprise a conductive material. The ion blocker 551 may have a plate shape. For example, the ion blocker 551 may have a disk shape. A plurality of through holes are formed at the ion blocker 551. The through holes are formed to penetrate the entire thickness of the ion blocker 551, providing vertical passage.

The ion blocker 551 is provided to be grounded. As the ion blocker 551 is grounded, ions and electrons among plasma components passing through the ion blocker 551 are attracted. That is, the ion blocker 551 functions as an ion blocker that blocks a passage of the ions to the second space 102, but allows radicals to enter into the second space 102. As the ion blocker 551 is grounded, only radicals among the plasma components pass through the through holes of the ion blocker 551 into the second space 102.

Figure 2:
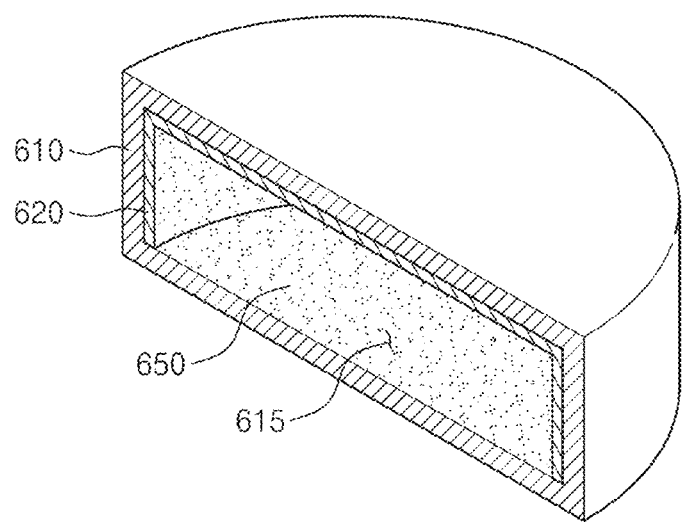
FIG. 2 is a cross-sectional perspective view of an electrodeless lamp according to an embodiment of the inventive concept.

An electrodeless lamp 600 is coupled to the ion blocker 551. FIG. 2 is a cross-sectional perspective view of the electrodeless lamp according to an embodiment. FIG. 1 will be described further with reference to FIG. 2. The electrodeless lamp 600 includes a housing 610 having a space 615 and a discharging material 650 the space 615. The housing 610 may be made of or comprise a material capable of transmitting an electric field applied from the plasma source 500. For example, the housing 610 may be made of or comprise a dielectric. For example, the housing 610 is made of a quartz or a Y2O3. The discharging material 650 may include a mixed gas of an inert gas and a luminous material. The luminous material is a material that emits a light when an electric field is applied, and may be a material including a sulfur, a metal sulfide, a metal halide (e.g., a compound such as Li, Ca, K, etc and F, Cl, Br, etc), a mercury or a fluorescent material. The inert gas may include Ar, a He, etc. The discharging material 650 fills the space 615 of the housing 610 such that the space 615 becomes a second pressure.

When discharged, the discharging material 650 emits a wavelength band capable of transferring a sufficient heat energy to the substrate W. According to the electrodeless lamp 600, a lifespan of the lamp is long and longer than that of other lamps, for example, electrode lamp and in the case of an electrodeless lamp filled with a discharging material including a metal sulfide, even if the pressure of the discharging space 615 of the lamp 600 increases due to a residual heat at the time of re-lighting, an instantaneous lighting is possible by thermoelectrons emitted from the metal of the metal sulfide.

The discharging space 615 may have a first volume, and a size of the first volume is provided in proportion to an electric field of the second intensity applied by the plasma source 500.

A reflective coating 620 may be provided on a wall surface of the discharging space 615 of the housing 610 except for a surface facing the substrate W. For example, the reflective coating 620 may be provided on a side wall and a top wall of the discharging space 615 of the housing 610. The reflective coating 620 suppresses a light loss and allows light to be directed to the substrate W. The reflective coating 620 may be made of or comprise a ZrO2. In addition, the reflective coating 620 may be designed in the form of a lens so that a light reaches the substrate W with a uniform intensity.

Referring back to FIG. 1, a second process gas supply unit 400 for supplying a second process gas is connected to the second space 102. The second process gas supply unit 400 includes a fourth gas supply source 451 and a fourth gas supply line 452. The flow rate adjusting members 453 and 454 are installed at the fourth gas supply line 452.

The fourth gas supply source 451 stores a fourth gas. The fourth gas is a nitrogen-containing gas or a hydrogen-containing gas. In an embodiment, the fourth gas is a $NH_3$.

The fourth gas supply line 452 is provided as a fluid passage connecting the fourth gas supply source 451 and the process chamber 100. The fourth gas supply line 452 supplies the fourth gas stored at the fourth gas supply source 451 to the inner space of the process chamber 100. Specifically, the fourth gas supply line 452 supplies the fourth gas to the second space 102.

The second process gas supply unit 400 may further include a fifth gas supply source 461 for supplying a fifth gas different from the fourth gas in order to further supply the gas mixing with the fourth gas. The fifth gas supply source 461 is connected to the fourth gas supply source 451 through the fifth gas supply line 462. A flow rate adjusting member 463 may be installed at the fifth gas supply line 462. The fifth gas is a nitrogen-containing gas or a hydrogen-containing gas. For example, the fifth gas may be a $H_2$.

The second process gas may be defined by a combination of the fourth gas and the fifth gas. Alternatively, the fourth gas may be defined alone as the second process gas. In addition to the presented embodiments, the second process gas may further include other gases in addition to above-mentioned gases.

The second process gas introduced into the second space 102 reacts with a plasma, e.g., radicals, introduced into the second space 102 and generated from the first process gas, to generate a reaction gas. In more detail, among the plasma generated from the first process gas, the radicals passing through the ion blocker 551 reacts with the second process gas to generate the reaction gas. In an embodiment, the radicals of the plasma generated from the first process gas is a fluorine radical F*, and the second process gas is an ammonium hydrogen fluoride $NH_4HF_2$ which is a mixture of an $NH_3$ and an $H_2$ and/or an ammonium fluoride $NH_4F$.

The reaction gas reacts with the substrate to remove a natural oxide film of the substrate.

The exhaust baffle 800 uniformly exhausts the plasma from each area in the treating space. The exhaust baffle 800 is positioned between an inner wall of the process chamber 100 and the substrate support unit 200 in the treating space. The exhaust baffle 800 may have an annular ring shape. A plurality of through holes 802 are formed at the exhaust baffle 800. The through holes 802 may provide vertical passages for exhausting. The through holes 802 are arranged along a circumferential direction of the exhaust baffle 800. The through holes 802 have a slit shape extending along a radial direction of the exhaust baffle 800.

An exhaust unit 700 including an exhaust port 150 for exhausting process by-products, an exhaust pump 720, an opening/closing valve 730, and an exhaust line 710 is installed downstream of the exhaust baffle 800 of the process chamber 100.

The exhaust line 710 is installed at the exhaust port 150, and the exhaust pump 720 is installed at the exhaust line 710. The exhaust pump 720 provides a vacuum pressure to the exhaust port 150. The by-products generated during a process and the process gas or the reaction gas remaining in the chamber 100 are discharged to the outside of the process chamber 100 by the vacuum pressure. The opening/closing valve 730 adjusts an exhaust pressure provided from the exhaust pump 720. The opening/closing valve 730 opens and closes the exhaust port 150. The opening/closing valve 730 may be moved to an opening position and a blocking position. Here, the opening position is a position where the exhaust port 150 is opened by the opening/closing valve 730, and the blocking position is a position where the exhaust port 150 is blocked by the opening/closing valve 730. The opening/closing valve 730 is provided with a plurality of valves installed at each area in a plane perpendicular to a lengthwise direction of the exhaust port 150, and may be adjusted respectively. A degree of opening of the valve 730 may be adjusted by a controller (not shown). According to an embodiment, a partial area of the exhaust port 150 is provided to be open during the process. The open area of the exhaust port 150 may be provided as an asymmetrical area. When viewed from above, this asymmetric open area may be provided to face only some of the divided areas.

Figure 3:
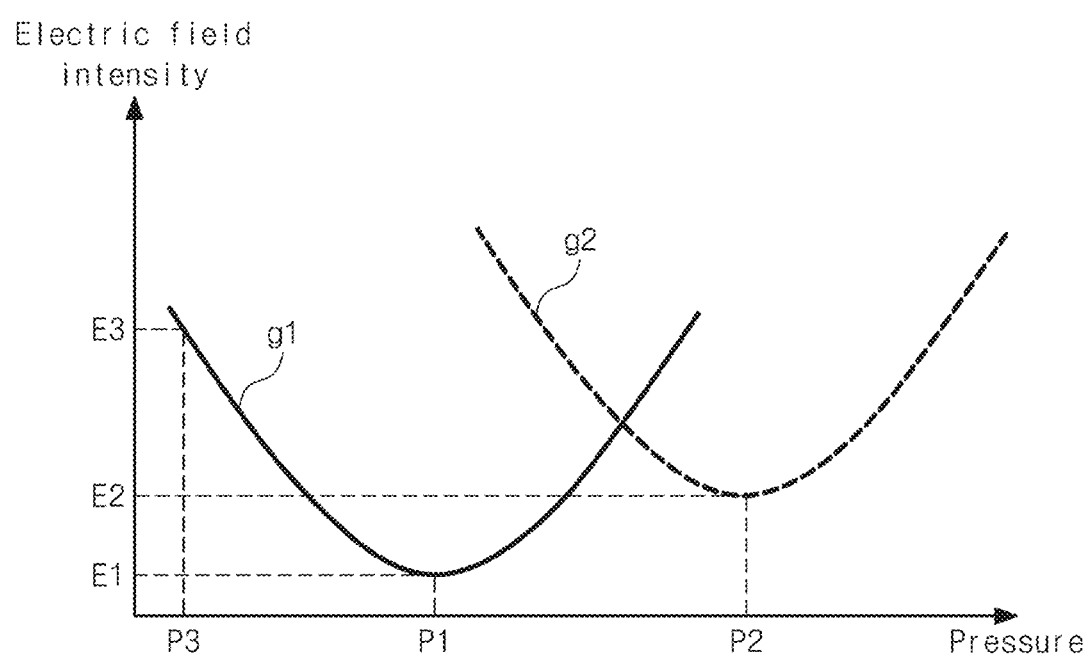
FIG. 3 is a graph which illustrates an electric field density (electric field intensity) for each pressure for a plasma excitation of a process gas and a discharge of an electrodeless lamp in accordance with an embodiment of the inventive concept.

FIG. 3 is a graph which illustrates an electric field density (electric field intensity) for each pressure for a plasma excitation of the process gas and a discharge of the electrodeless lamp in accordance with an embodiment of the inventive concept. A method of operating the substrate treating apparatus according to an embodiment of the inventive concept will be described with reference to FIG. 3. g1 illustrates the electric field intensity according to pressure for exciting the process gas to the plasma, and g2 illustrates the electric field intensity according to pressure to discharge the discharging material.

When setting each of the minimum electric field intensities E1 and E2 for discharging, the minimum electric field intensity E2 for discharging material 650 of the electrodeless lamp in the discharging space 615 is set higher than the minimum electric field intensity E1 for exciting the first process gas in the first space 535. When a pressure of the first space 535 is positioned near P1 and the electric field intensity is provided between E1 and E2, the first process gas is excited to the plasma, but the discharging material 650 is not discharged. And, if a supply of the first process gas and the second process gas is stopped and the electric field intensity is provided between E2 and E3 under the pressure of the first space 535 being P3, the discharging material 650 in the discharging space 615 is fixed at a pressure of P2, and thus is discharged regardless of the pressure of the first space 535.

Figure 4:
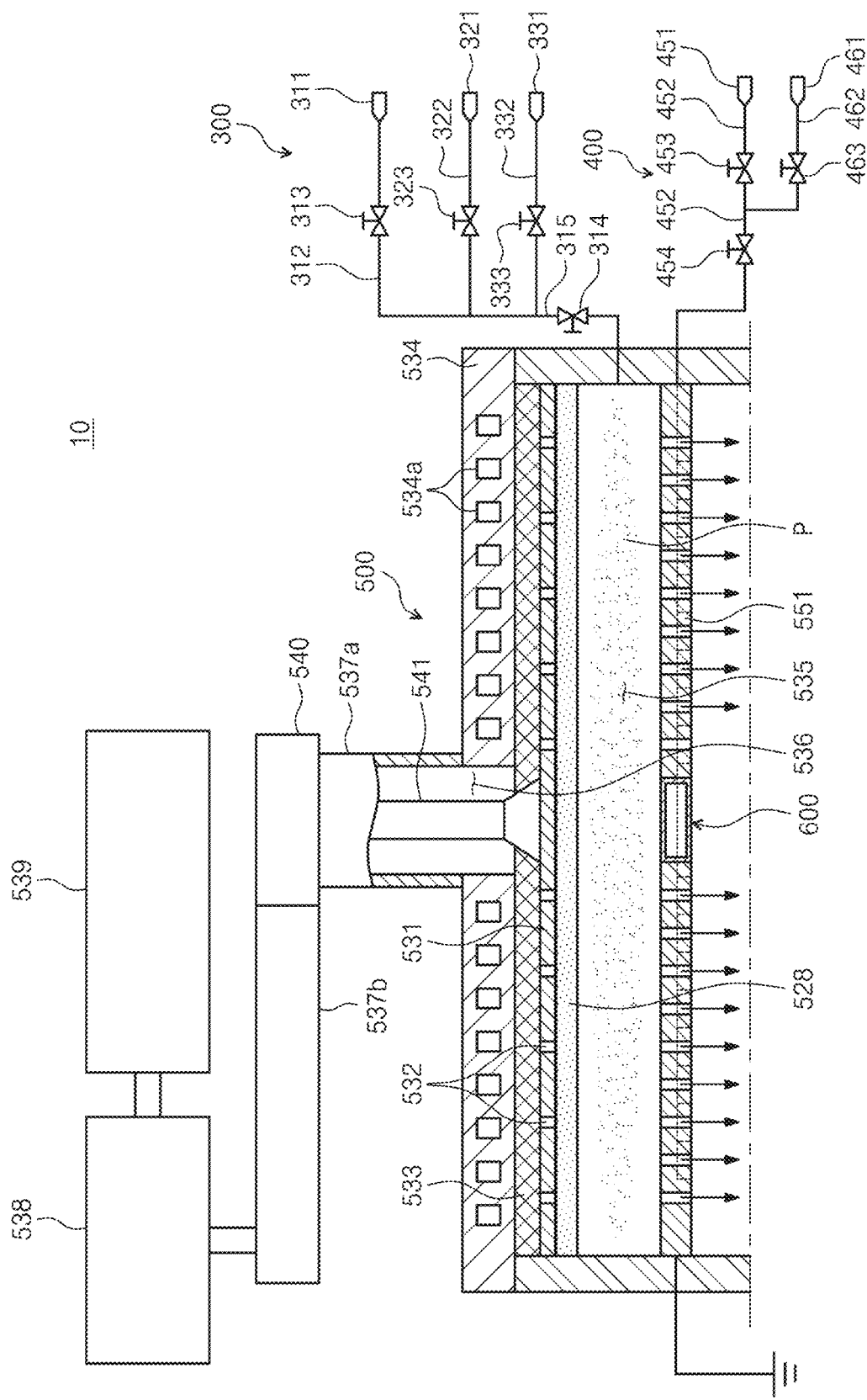
FIG. 4 illustrates a state in which the substrate treating apparatus performs a first treatment according to the first embodiment of the inventive concept.

FIG. 4 illustrates a state in which the substrate treating apparatus performs the first treatment according to an embodiment of the inventive concept. A method of performing the first treatment will be described with reference to FIG. 4. In an embodiment, the first treatment is to dry-clean the substrate.

The substrate W is introduced into the second space 102 of the chamber 100 and supported by the support unit 200, and the flow rate adjusting members 313, 314, 323, and 333 of the first gas supply unit 300 are opened to apply the first process gas to the first space 535. The first space 535 has a first pressure atmosphere by the first process gas, and the plasma source 500 applies an electric field of a first intensity (an intensity between E1 and E2 in FIG. 3) to the first space 535 to excite the first process gas to the plasma P. The radical component of the plasma P passes through the ion blocker 551 and moves to the second space 102. The flow rate adjusting members 454, 453, and 463 of the second gas supply unit 400 are opened to apply the second process gas to the second space 102. The radical component of the plasma P and the second process gas react to form an etchant (cf. HF, $NH_4F$, etc.), and by-products (cf. $(NH_4)_2SiF_6$, etc.) are produced by chemically reacting with a target film of the substrate W.

Figure 5:
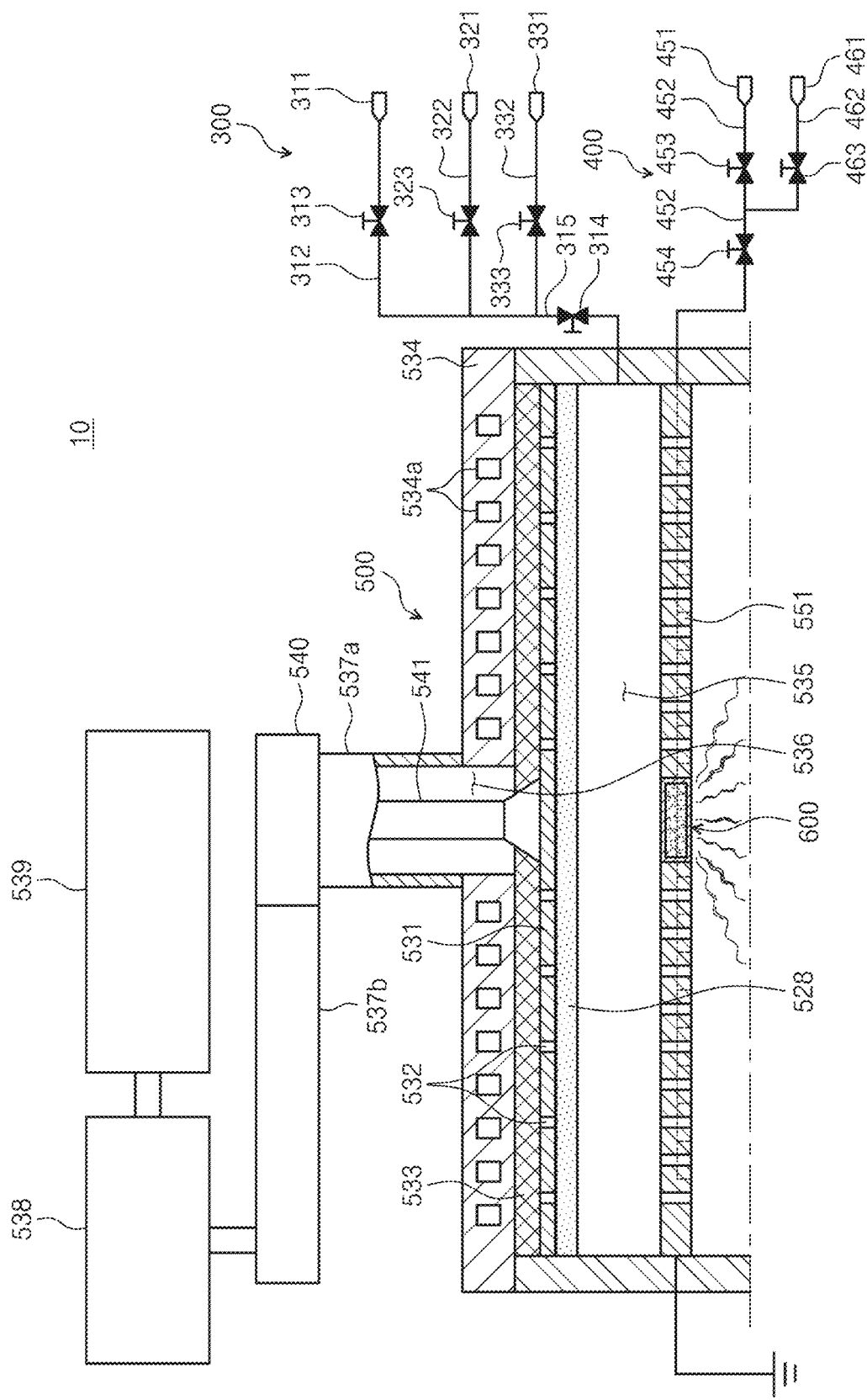
FIG. 5 illustrates a state in which the substrate treating apparatus performs a second treatment according to the first embodiment of the inventive concept.

FIG. 5 illustrates a state in which the substrate treating apparatus performs the second treatment according to an embodiment of the inventive concept. A method of performing the second process will be described with reference to FIG. 5. In an embodiment, the second treatment is to remove by-products by heat-treating the substrate.

The discharging gas 650 of the electrodeless lamp 600 is discharged to sublimate a surface by-product by increasing a surface temperature of the substrate W. The discharging material 650 is discharged to generate a light having a wavelength which could be adsorbed by the by-product and converted into a heat to sublimate the by-product. A supply of the first process gas and the second process gas is stopped, and the exhaust unit 700 is operated to lower an inner pressure of the first space 535 and the second space 102 to a third pressure P3 lower than the first pressure P1. In addition, the plasma source 500 applies an electric field having a second intensity (an intensity between E2 and E3 in FIG. 3) to the charging space 615 of the electrodeless lamp 600 to discharge the charging gas 650. A discharged light reaches the substrate W and is converted into a heat to sublimate the by-product.

Figure 6:
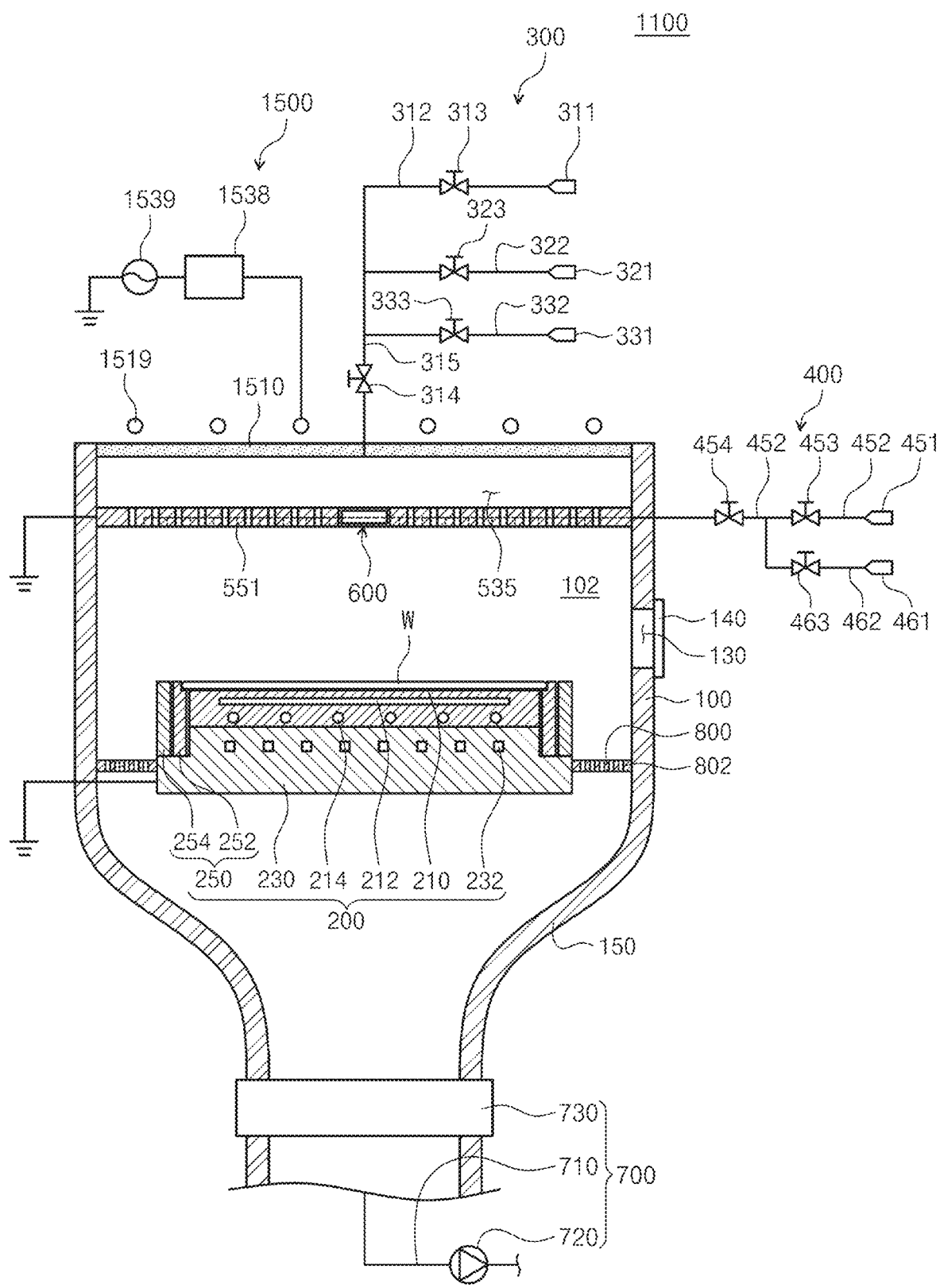
FIG. 6 is a schematic cross-sectional view of the substrate treating apparatus according to a second embodiment of the inventive concept.

FIG. 6 is a schematic cross-sectional view of the substrate treating apparatus according to the second embodiment of the inventive concept. In the description of the substrate treating apparatus 1100 according to the second embodiment, configurations of the substrate treating apparatus 10 which are the same as the first embodiment are replaced with the descriptions of the first embodiment.

In the substrate treating apparatus 1100 according to the second embodiment, the plasma source 1500 is provided as an ICP type. The plasma source 1500 includes a coil-shaped antenna 1519. A dielectric plate 1510 is provided under the antenna 1519. The dielectric plate 1510 and the ion blocker 551 are provided to be spaced apart from each other, and a space in which the dielectric plate 1510 and the ion blocker 551 are spaced apart is provided as a first space 535. The antenna 1519 is connected to a high frequency power source 1539 through a matcher 1538. The antenna 1519 receiving a power from the high frequency power source 1539 forms an electric field in the first space 535. A supply port of the first gas supply unit 300 may be provided through a center of the dielectric plate 1510.

Figure 7:
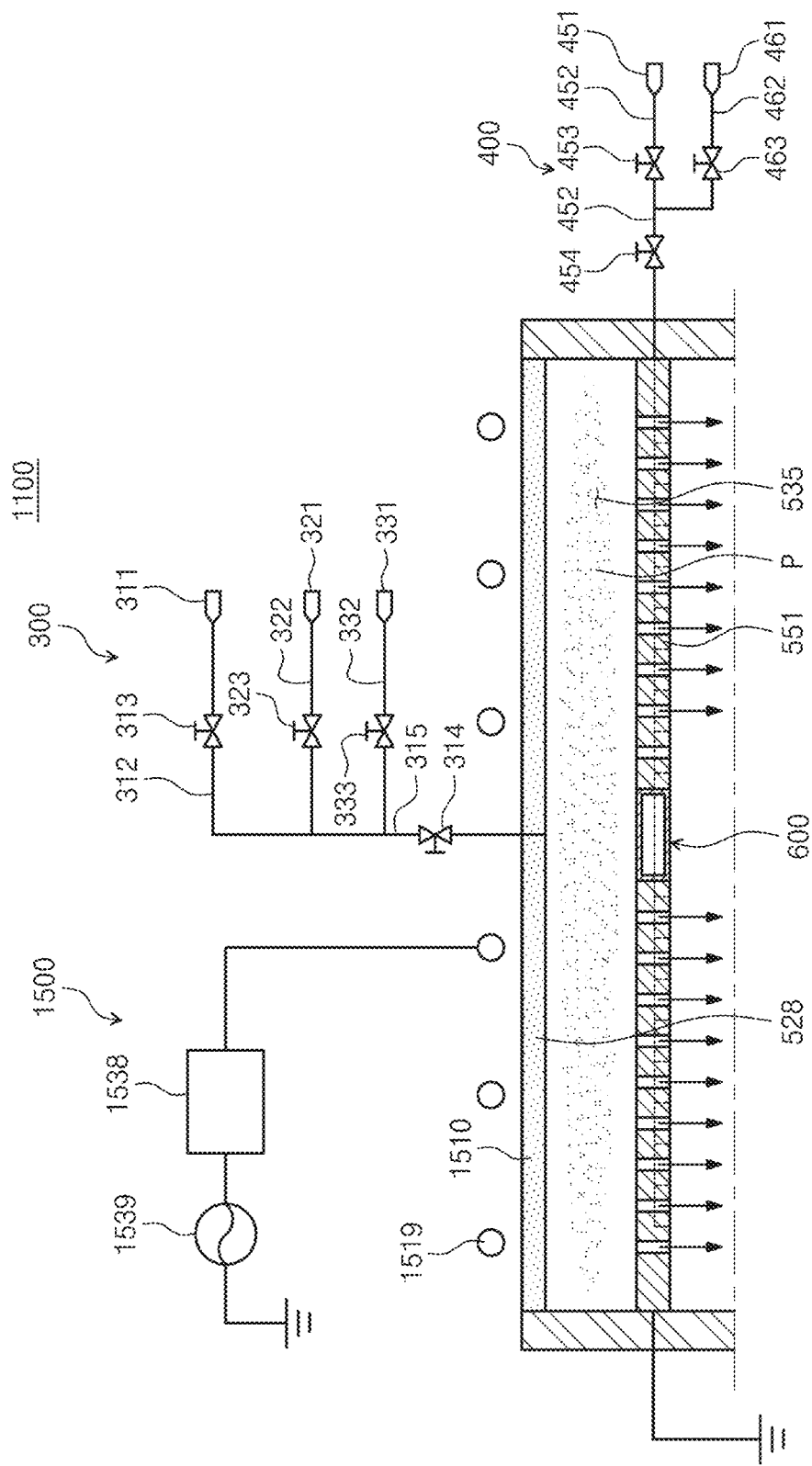
FIG. 7 illustrates a state in which the substrate treating apparatus performs the first treatment according to the second embodiment of the inventive concept.

FIG. 7 illustrates a state in which the substrate treating apparatus performs the first treatment according to the second embodiment of the inventive concept. Referring to FIG. 7, a method of performing the first treatment using the substrate treating apparatus according to the second embodiment will be described. In an embodiment, the first treatment is to dry-clean the substrate.

The substrate W is introduced into the second space 102 of the chamber 100 and supported by the support unit 200, and the flow rate adjusting members 313, 314, 323, and 333 of the first gas supply unit 300 are opened to apply the first process gas to the first space 535. The first space 535 has a first pressure atmosphere formed by the first process gas, and the plasma source 1500 applies an electric field having a first intensity (an intensity between E1 and E2 in FIG. 3) to the first space 535 to excite the first process gas to the plasma P. The radical component of the plasma P passes through the ion blocker 551 and moves to the second space 102. The flow rate adjusting members 454, 453, and 463 of the second gas supply unit 400 are opened to apply the second process gas to the second space 102. The radical component of the plasma P and the second process gas react to form an etchant (cf. HF, NH$_4$F, etc.), and by-products (cf. (NH$_4$)$_2$SiF$_6$, etc.) are produced by chemically reacting with a target film of the substrate W.

Figure 8:
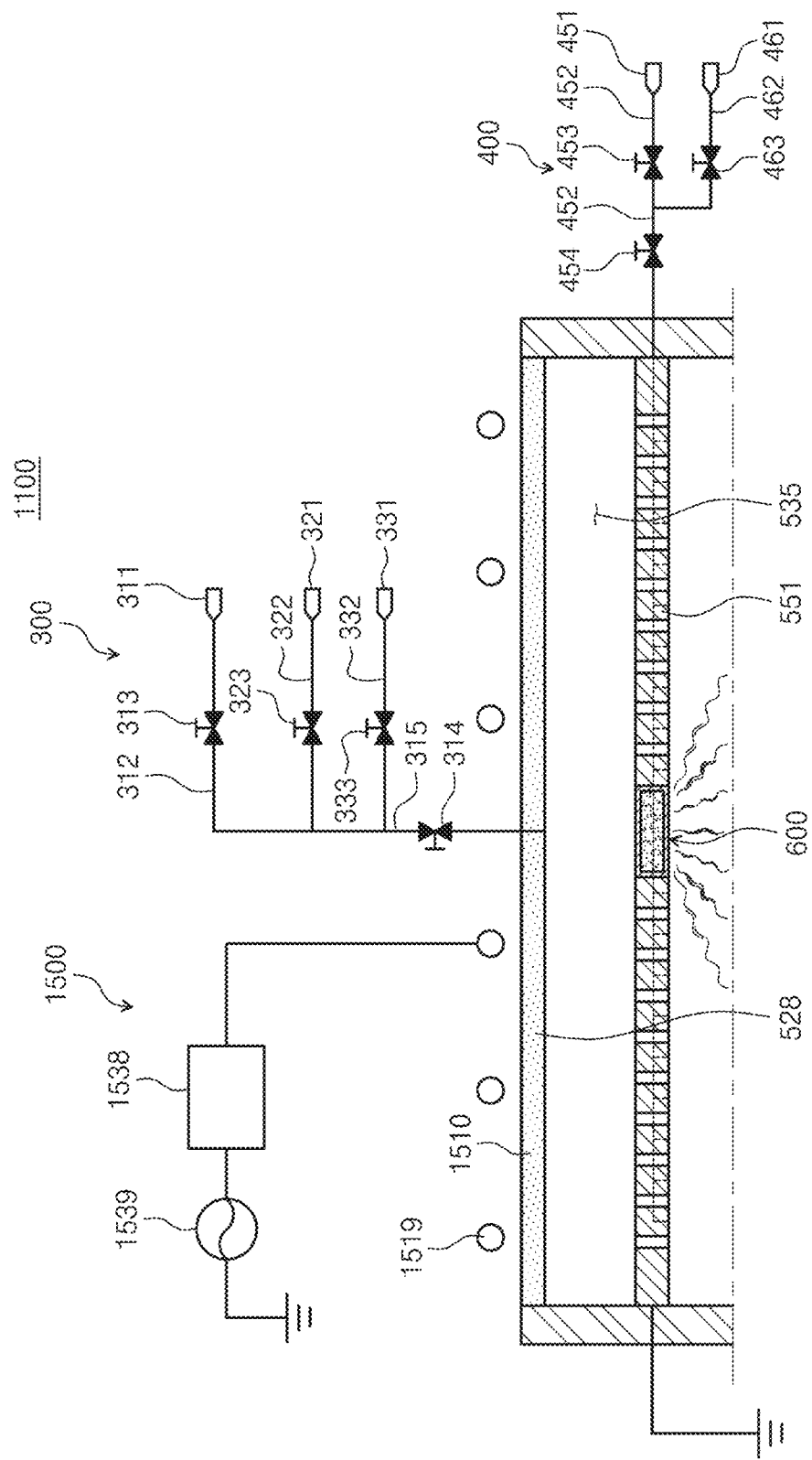
FIG. 8 illustrates a state in which the substrate treating apparatus performs the second treatment according to the second embodiment of the inventive concept.

FIG. 8 illustrates a state in which the substrate treating apparatus performs the second treatment according to the second embodiment of the inventive concept. Referring to FIG. 8, a method of performing the second treatment using the substrate treating apparatus according to the second embodiment will be described. In an embodiment, the second treatment is to remove by-products by heat-treating the substrate.

The discharging gas 650 of the electrodeless lamp 600 is discharged to sublimate the surface by-product by increasing the surface temperature of the substrate W. A light generated by the discharged discharging gas 650 is designed to have a wavelength which is absorbed by the surface by-product of the substrate W, and is converted into a heat to sublimate the by-product. The supply of the first process gas and the second process gas is stopped, and the exhaust unit 700 is operated to lower the inner pressure of the first space 535 and the second space 102 to a third pressure P3 lower than the first pressure P1. In addition, the plasma source 1500 applies the electric field having a second intensity (an intensity between E2 and E3 in FIG. 3) to the discharging space 615 of the electrodeless lamp 600 to discharge the discharging gas 650. The discharged light reaches the substrate W and is converted into a heat to sublimate the by-product.

As described above, the controller may control components of the substrate treating apparatus and a facility to treat the substrate according to a setting process. In addition, the controller may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Although not shown, a plurality of electrodeless lamps 600 may be provided. The plurality of electrodeless lamps 600 are installed at the ion blocker 5510.

The inventive concept is not limited to the embodiments and can be modified in various ways. For example, a configuration of the treating apparatus is not limited to the above embodiment as long as the configuration requirements of the inventive concept are satisfied. In addition, the plasma treatment of the target is not limited to dry cleaning, and may be applied to various treatments such as an oxidation treatment, a film formation treatment, and an etching treatment. In addition, an object to be treated on which the plasma treatment is performed is not limited to a semiconductor wafer, and may be any other material such as a flat panel display substrate.

According to various embodiments of the inventive concept, using a single power source, it is possible to perform a treatment by exciting a process gas to a plasma and supplying of a heat energy for removing by-products. In addition, the plasma treatment and the heat treatment may be performed in one chamber. In addition, a use of electrodeless lamps can increase a replacement cycle compared to other lamps.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a chamber having an inner space;
   a plasma source configured to apply an electric field;
   a first gas supply unit configured to supply a first process gas to a region to which the plasma source applies the electric field, the first process gas excited to a plasma when the first process gas is applied with an electric field of a first intensity at a first pressure atmosphere;
   a support unit disposed in the inner space and configured to support a substrate to be treated; and
   an electrodeless lamp disposed above the substrate in the inner space, and
   wherein the electrodeless lamp comprises:
   an electric field transmissive housing having a discharging space therein; and
   a discharging material including a luminous material and filling the discharging space, the discharging space of the housing being pressurized to a second pressure, and the discharging material discharging and luminating when applied with an electric field of a second intensity higher than the first intensity at a second pressure.

2. The substrate treating apparatus of claim 1, wherein the luminous material comprises a sulfur-containing material, a metal sulfide, a metal halide, a mercury, or a fluorescent material.

3. The substrate treating apparatus of claim 1, wherein the discharging material is a mixed gas of an inert gas and the luminous material.

4. The substrate treating apparatus of claim 1, wherein the second pressure is higher than the first pressure.

5. The substrate treating apparatus of claim 1, wherein the discharging space of the housing has a first volume, and a size of the first volume is in proportion to an electric field of the second intensity applied by the plasma source.

6. The substrate treating apparatus of claim 1, wherein the housing comprises a dielectric.

7. The substrate treating apparatus of claim 1, wherein the housing comprises a quartz or a $Y_2O_3$.

8. The substrate treating apparatus of claim 1 further comprises a plate-shape ion blocker dividing the inner space of the chamber into a first space and a second space below the first space, having a plurality of through-holes, and grounded, and
   wherein the electrodeless lamp is coupled to the ion blocker.

9. The substrate treating apparatus of claim 8, wherein the first gas supply unit supplies the first process gas to the first space.

10. The substrate treating apparatus of claim 9 further comprises a second gas supply unit configured to supply a second process gas to the second space, and wherein the plasma source is configured to supply the electric field to the first space.

11. The substrate treating apparatus of claim 1, wherein the first supply gas is gas including a fluorine.

12. The substrate treating apparatus of claim 10, wherein the second process gas is a gas including a hydrogen.

13. The substrate treating apparatus of claim 8, wherein the electrodeless lamp is provided at a center of the ion blocker.

14. The substrate treating apparatus of claim 1, wherein the electrodeless lamp is provided in a plurality.

15. The substrate treating apparatus of claim 1, wherein a side wall and a top wall of the discharging space of the housing comprise a reflective coating.

16. The substrate treating apparatus of claim 1 further comprises a controller, and
   wherein the controller is configured to perform:
   a first treating for a divergence of the electric field of the first intensity by the plasma source at the first pressure atmosphere while supplying the first process gas from the first gas supply unit to generate a plasma from the first process gas, and treating a substrate with radicals or ions of the plasma; and
   a second treating for discharging the electrodeless lamp to heat treat a substrate by stopping the supplying of the first process gas, exhausting the first process gas in the inner space and causing the plasma source to diverge the electric field of the second intensity.

17. The substrate treating apparatus of claim 10 further comprises a controller, and
   wherein the controller is configured to perform:
   a first treating for a divergence of an electric field of the first intensity by the plasma source at the first pressure atmosphere while supplying the first process gas from the first gas supply unit and supplying the second process gas from the second gas supply unit to generate a plasma from the first process gas, and treating a substrate with a reaction resultant between radicals of the plasma and the second process gas; and
   a second treating for discharging the electrodeless lamp to heat treat a substrate by stopping the supplying of the first process gas and the second process gas, exhausting the reaction resultant and causing the plasma source to diverge the electric field of the second intensity.

18. The substrate treating apparatus of claim 1, wherein the plasma source is selected from a group consisting of an ICP, a TCP, a CCP, a DF-CCP, and a microwave.

19. The substate treating apparatus of claim 1, wherein a light from the electrodeless lamp includes a wavelength which can be absorbed by by-products of a surface of the substrate.

20. A substrate treating apparatus comprising:
   a chamber having an inner space;
   a plate-shape ion blocker dividing the inner space of the chamber into a first space and a second space below the first space, having a plurality of through holes, and grounded;
   a plasma source configured to apply an electric field to the first space;
   a first gas supply unit configured to supply a first process gas to the first space, the first process gas excited to a plasma when the first process gas is applied with an electric field of a first intensity at a first pressure atmosphere;
   a second gas supply unit configured to supply a second process gas to the second space;
   a support unit disposed in the second space and configured to support a substrate to be treated; and an electrodeless lamp disposed at a center of the ion blocker; and a controller, wherein the electrodeless lamp comprises:

an electric field transmissive housing having a discharging space therein; and a discharging material including a luminous material and filling the discharging space, the discharging space of the housing being pressurized to a second pressure, and the discharging material discharging and luminating when applied with an electric field of a second intensity higher than the first intensity at a second pressure atmosphere, and the controller is configured to perform:

a first treating for a divergence of an electric field of the first intensity by the plasma source at the first pressure atmosphere while supplying the first process gas from the first gas supply unit and supplying the second process gas from the second gas supply unit to generate a plasma from the first process gas, and treating a substrate with a reaction resultant between radicals of the plasma and the second process; and a second treating for discharging the electrodeless lamp to heat treat a substrate by stopping the supplying of the first process gas and the second process gas, exhausting the reaction resultant and causing the plasma source to diverge the electric field of the second intensity.

* * * * *